(12) United States Patent
Wierach

(10) Patent No.: US 8,461,745 B2
(45) Date of Patent: Jun. 11, 2013

(54) PIEZOCERAMIC SURFACE ACTUATOR AND METHOD FOR THE PRODUCTION THEREOF

(75) Inventor: Peter Wierach, Braunschweig (DE)

(73) Assignee: Deutsches Zentrum für Luft- und Raumfahrt e.V., Cologne (DE)

( * ) Notice: Subject to any disclaimer, the term of this patent is extended or adjusted under 35 U.S.C. 154(b) by 576 days.

(21) Appl. No.: 12/377,888

(22) PCT Filed: Jul. 11, 2007

(86) PCT No.: PCT/DE2007/001235
§ 371 (c)(1),
(2), (4) Date: Jul. 29, 2010

(87) PCT Pub. No.: WO2008/025315
PCT Pub. Date: Mar. 6, 2008

(65) Prior Publication Data
US 2010/0295420 A1    Nov. 25, 2010

(30) Foreign Application Priority Data

Aug. 29, 2006  (DE) .......................... 10 2006 040 316

(51) Int. Cl.
*H01L 41/08* (2006.01)
(52) U.S. Cl.
USPC ............................ 310/328; 310/366; 310/365
(58) Field of Classification Search
USPC ................. 310/328, 363–368, 311, 341, 348, 310/317, 340
IPC ....................................................... H01L 41/08
See application file for complete search history.

(56) References Cited

U.S. PATENT DOCUMENTS

| 307,306 A | 10/1884 | Jadwin |
| 4,849,668 A | 7/1989 | Crawley et al. |

(Continued)

FOREIGN PATENT DOCUMENTS

| DE | 10051784 | 10/2000 |
| DE | 19928189 | 4/2001 |
| DE | 10051784 | 8/2002 |
| EP | 0509488 | 10/1992 |
| EP | 1090835 | 4/2001 |
| WO | WO9520827 | 8/1995 |
| WO | WO2005067071 | 7/2005 |
| WO | WO 2005067071 A1 * | 7/2005 |

*Primary Examiner* — Thomas Dougherty
*Assistant Examiner* — Karen B Addison
(74) *Attorney, Agent, or Firm* — Whitham Curtis Christofferson & Cook, PC

(57) ABSTRACT

A piezoceramic surface actuator comprising multilayer plates each having a plurality of piezoceramic plates separated from one another by in each case a positive or negative electrode. The positive and negative electrodes alternate and are constructed integrally with the piezoceramic plates, and have collector electrode surfaces for the positive and negative electrodes, which are connected to the associated positive or negative electrodes in a conducting manner and are arranged on two exterior sides of the surface actuator that are opposite from one another. The multilayer plates are plate-shaped and have a much greater width of the piezoceramic plates, defined by the distance between the opposite collector electrode surfaces, than the thickness of the multilayer plates. The collector electrode surface in each case contacts the positive or negative electrodes of the neighboring multilayer plates.

12 Claims, 3 Drawing Sheets

U.S. PATENT DOCUMENTS

| | | |
|---|---|---|
| 4,876,776 A | 10/1989 | Whatmore et al. |
| 5,305,507 A | 4/1994 | Dvorsky et al. |
| 5,347,870 A | 9/1994 | Dosch et al. |
| 5,378,974 A | 1/1995 | Griffin |
| 5,475,278 A * | 12/1995 | Inagawa et al. ............... 310/343 |
| 5,485,053 A | 1/1996 | Baz |
| 5,657,882 A | 8/1997 | Johnson |
| 5,687,462 A | 11/1997 | Lazarus et al. |
| 5,894,651 A | 4/1999 | Dvorsky et al. |
| 6,208,026 B1 | 3/2001 | Bindig et al. |
| 7,156,938 B2 * | 1/2007 | Baumgartner et al. ....... 310/311 |
| 7,268,468 B2 * | 9/2007 | Schoor ......................... 310/328 |

* cited by examiner

PIEZOCERAMIC SURFACE ACTUATOR AND METHOD FOR THE PRODUCTION THEREOF

BACKGROUND OF THE INVENTION

Field of the Invention

The invention relates to a piezoceramic surface actuator having a plurality of piezoceramic plates separated from one another by in each case a positive or negative electrode, wherein the positive and negative electrodes alternate and are constructed integrally with the piezoceramic plates, and having collector electrode surfaces for the positive and negative electrodes, which are connected to the associated positive or negative electrodes in a conducting manner and are arranged on two exterior surfaces of the surface actuator that are opposite from one another.

The invention also relates to a process for the production of a piezoceramic surface actuator with the steps of
a) producing a monolithic cuboidal ceramic block comprising a plurality of piezoceramic plates respectively separated from one another by a positive or negative electrode, wherein the positive and negative electrodes alternate and are constructed integrally with the piezoceramic plates,
b) applying electrically conducting collector electrode surfaces to two opposite exterior sides of the surface actuator in such a way that the collector electrode surfaces are connected to the associated positive or negative electrodes in a conducting manner.

Background Description

Actuators and sensors based on multifunctional materials are an essential component of adaptive structures. As integral components of the structure, in the best case they also undertake a load-bearing function. Multifunctional materials, often also referred to as "smart materials", are energy converters which react to an external stimulus in a technically usable way. Most frequently used are materials which react to an electric, thermal or magnetic field by a change in their mechanical properties. The most well-known of these are piezoceramics (force effect/deformation in the electric field), shape memory alloys (temperature-dependent force effect/deformation) or electrorheological and magnetorheological fluids (influencing of the shear transmission in the electromagnetic field). The effect often works in both directions, so that the corresponding materials can be used not only for actuating but also for sensing.

On account of a string of advantages, it this respect piezoceramics are currently the most frequently used multifunctional materials. The function of piezoceramics is based on the piezoelectric effect, which describes the interaction between the mechanical state and the electrical state of a special class of crystals. If electric charges are produced in proportion to the deformations of the crystal, this is referred to as a direct piezoelectric effect. This effect can be used for sensing, by the electric charges being detected by means of a suitable measuring instrument. The opposite of this effect is known as the inverse piezoelectric effect, in which the crystal changes its shape under the influence of an electric field. This effect is exploited to use piezoceramics for actuating purposes.

Piezoceramic materials have the advantage that they can be used in a great frequency range to far into the kHz range, have great stiffness of typically 60 GPa and can be easily activated by means of an electric field.

Piezoceramics are mass produced on an industrial scale and can be obtained from various suppliers in various forms at a reasonable price. One disadvantage of piezoceramics, however, lies in the nature of ceramic materials, piezoceramics are brittle and consequently susceptible to breakage. While they can withstand compressive loads very well, tensile loads must most certainly be avoided. The reliable further processing and structural integration of the generally highly sensitive materials therefore involves a certain effort and an element of risk.

Therefore, a concept which is advantageous and meets industrial requirements is that of further processing the respective materials initially into compact and easy-to-handle components in the form of piezo composites piezo composites are composite materials consisting of piezoceramic materials and polymer materials, for example synthetic resins. By combination with ductile polymer materials, for example by encapsulating or adhesive bonding, improvements in properties can be achieved for specific applications. The piezo composites produced in this way are distinguished in particular by reduced fragility. The arrangement of the piezoceramic materials in the composite, structure additionally allows material properties, such as for example stiffness or damping, to be specifically set. Further more, necessary additional components, such as electrodes, energy supply conductors, insulators, etc., can also be incorporated. Only in a second step are the actuators and sensors combined with the structural material or the structure.

A major field of application is the use of films in ultrasonic technology. For constructing ultrasonic transducers, which are mainly used in medical diagnostics for nondestructive material testing and in solar technology. In adaptronics, piezo composites are mainly used for reducing, producing or detecting structural deformations for noise, vibration and shape control. Adaptronics is particularly concerned here with distributed actuator and sensor technology. By contrast with discrete actuators, as for example in the case of piezoelectric stack actuators, the introduction of force does not take place at two explicit points but by shearing over a two-dimensional connection, generally over an adhesive layer. In, particular for lightweight construction, two-dimensional actuators/sensors, which will be referred to hereafter as surface actuators, are of great significance, since sturdy force introduction points are not required. With weight and installation space optimized, the surface actuators (actuators and sensors) are incorporated in thin-walled lightweight structures and influence vibrations and deformations directly at their place of origin. In comparison with discrete actuators, the stiffness, and consequently efficiency, of which decreases in principle with increasing length, surface actuators can be made to any length without any loss in efficiency.

It is also true here that improved properties are achieved by combining the brittle ceramic material with a polymer material. Encapsulating with the polymer generally takes place at elevated temperatures, typically 120° C. Different coefficients of thermal expansion of the polymer material and of the ceramic as well as the shrinkage of the polymer during curing cause an in-plane compressive prestress of the ceramic material. This allows piezo composites also to be subjected to tensile loading within certain limits.

The main advantages in the use of piezo composites are consequently the protection of the brittle piezoceramic from external loads, the improved ease of handling, the simple electrical contacting, an electrically insulated actuator, the compressive prestress of the piezoceramic caused by different coefficients of thermal expansion of the insulating material or the embedding compound and the piezoceramic, the reduction of stress peaks in the ceramic with inhibited crack propagation, greater passive deformability, increased service life of the transducers and the possibility of realizing complex architectures.

Starting materials for the production of piezoceramic surface actuators are primarily thin piezoceramic wafers, also referred to as piezo films, and piezoceramic fibers, which are produced by various processes, with various compositions and with various dimensions.

Of the three directionally dependent piezoelectric sub-effects, longitudinal effect or $d_{33}$ effect
transverse effect or $d_{31}$ effect and
shear effect or $d_{15}$ effect, almost exclusively the longitudinal and transverse effects are, exploited for piezo composites in electronics. The relationship between strain and electric field would be described by way of the material-specific charge constant "d", a linear relationship between strain and electric field being assumed for the sake of simplicity. The indices in this case identify the cause and effect and relate to coordinate directions of a system of coordinates customary in material science.

In the case of the $d_{31}$ effect, the strain occurring transversely to the applied electric field is used. The electric field is applied in the 3 direction (cause) and used in the 1 direction (effect). The $d_{31}$ constant is negative, since, when a positive electric field is applied in the 3 direction, a contraction of the piezoceramic takes place in the 1 direction. By analogy with this, in the case of the $d_{33}$ effect, the strain of the piezoceramic in the 3 direction is used when a positive electric field is applied in the 3 direction. Since, in this configuration, the ceramic body undergoes strain in terms of elongatation, the $d_{33}$ constant is positive. Depending on which of the two effects is exploited, one also speaks of "elongators" or "contractors".

The arrangement of the electrodes is therefore decisive for which of the two effects is exploited. The simplest construction for a surface actuator is obtained for the effect. In this case, a simple two-dimensional electrode applied on both sides of a thin piezo film is sufficient. The electric field then forms homogeneously between the electrodes. However, the thickness of the piezoceramic defines the electrode spacing, and consequently the voltage required to produce a specific electric field. A customary thickness is one of approximately 0.2 mm, for which a voltage of 200 V is required to produce an electric field of 1 kV/mm.

Piezoceramic surface actuators which exploit the $d_{31}$ effect are described, for example, in WO 95/20827, U.S. Pat. No. 5,894,651 A and DE 100 51 784 C1. In DE 100 51 784 C1, it is proposed for contacting the electrodes to use a fine mesh of copper wires, which is embedded together with the piezoceramic in a polymer during the production process and covers the electrodes almost completely. This has the effect, in particular in the transitional region from the active region to the passive region, of producing a flexible and reliable electrical connection, which is insensitive to the occurrence of cracks even under high dynamic loads. It is ensured by the complete coverage of the electrode that, even in the event of a rupture, all fragments continue to be contacted and the performance of the ceramic is influenced only slightly.

Monolithic $d_{33}$ surface composites are known, for example, from U.S. Pat. No. 307,306 B1 and No. 6,208,026 B1. To apply the electric field in the 3 direction, a comb electrode is etched into a copper-coated polyamide film and adhesively bonded with the filth. The use of monolithic films in conjunction with comb electrodes is problematic electrode spacings and the width of the finger electrode are comparatively great, in order that the effect of the inhomogeneous electric field does not lead to the ceramic being damaged during operation.

It is also known to use a laser to provide the monolithic piezo film with multiple scores in the longitudinal direction of the actuator, but not to cut right through it. This measure achieves a directional effect of the transducer, since the stiffness of the scores is greater than transversely thereto.

On account of the inhomogeneous electric fields, monolithic piezo films are only conditionally suitable for the construction of $d_{33}$ transducers with comb electrodes. It is attempted to favorably influence the fatigue strength properties of piezo composites by means of fiber-like architectures of the piezoceramic starting material, since cracks which occur in individual piezo fibers do not continue through the entire ceramic body but are stopped at the boundaries with the polymer.

In the case of piezo fiber composites, piezoceramic fibers are encapsulated with a polymer in a monolayer. The introduction of the electric field takes place once again by way of a comb electrode using flexible conductor tracks (polyimide film) produced by means of etching technology or polyester films printed with conductive adhesive.

In the case of these piezo fiber composites, the diameter of the individual fibers lies between 150 and 250 µm. A major disadvantage of the technology is the very complex production. Each fiber must be introduced individually and aligned in the composite. Moreover, the starting material, the piezo fiber, is many times more expensive than piezo films.

U.S. Pat. No. 6,629,341 B2 discloses the use of inexpensive piezo films for producing piezo fibers of a rectangular cross section by mechanically cutting up the piezo films. For cutting up the piezo films, wafer saws from the semiconductor industry are used. Non-electroded, monolithic piezo films are sawn into thin strips and subsequently adhesively bonded with flexible conductor tracks of polyimide and an etched comb electrode structure. Sawing of the piezo film has the effect of significantly reducing the stiffness of the actuator transversely to the sawing direction, whereby a directional actuatory effect is also obtained for this composite. The rectangle fiber cross section and an optimized electrode geometry typically produce strain values of 1600 µm per meter at a voltage of 1500. V.

A major requirement in the application of actuatory piezo composites is a work capacity that is as great as possible. The actuators must therefore be able to produce the highest possible forces and displacements. The maximum forces and displacements are predetermined by the piezoceramic material. Although the strains and forces are achieved by exploiting the longitudinal piezoelectric effect ($d_{33}$ effect), the previous technical solutions for achieving this $d_{33}$ effect, which are based on comb-like surface electrodes, have a series of disadvantages. These are the inhomogeneous field distribution in the ceramic material, the high electromechanical loading of the piezoelectric material in regions with high field gradients, the occurrence of cracks in regions with high field gradients, the reduction in the service life due to cracks (electric breakdowns), the reduction in stiffness of the actuator due to cracks, and consequently a reduction in the work capacity, the extremely high operating voltages required, of up to 2 kV, to be able to produce adequately high electric fields, passive (unused) regions under the comb, electrodes and the complex and expensive production.

It is also disadvantageous that the thickness of the actuators can only be set to a very limited extent. There is a direct relationship between the electrode spacing and the thickness of the piezoceramic material. The thicker the material, the greater the electrode spacing must also be chosen to enable the field to penetrate the entire cross section. However, at the same time the operating voltage increases and becomes unacceptably high. Thicknesses over 0.2 mm are therefore generally not practicable. This would, however, be desirable to increase the force effect of the actuator.

Very much more homogeneous electric fields are achieved by exploiting the transverse piezoelectric effect ($d_{31}$ effect) with surface electrodes. This does indeed avoid a series of disadvantages. However, the maximum achievable strains are much lower and are around 35% of the $d_{31}$ effect. Here, too, thick actuators lead to an increase in the operating voltage. In the case of $d_{31}$ transducers, the required operating voltage for producing a required electric field is obtained directly from the spacing of the electrodes, and consequently from the thickness of the piezo electrode material. The thicker the material, the higher the operating voltage.

SUMMARY OF THE INVENTION

The object of the present invention is therefore to provide an improved piezoelectric surface actuator which exploits the $d_{33}$ effect and can produce high strains at low operating voltages.

The object is achieved with the piezoelectric surface actuator of the type stated at the beginning by the surface actuator being plate-shaped and having a much greater width of the piezoceramic plates, defined by the distance between the opposite collector electrode surfaces, than the thickness of the surface actuator and being embedded in a plastic.

The surface actuators are based on piezoceramic multilayer actuators, which are a further development of conventional piezoceramic stack actuators. Conventional stack actuators are produced from piezoceramic plates arranged in a stack and adhesively bonded to one another. The plates are in this case surface-electroded and, when an electric field is applied, undergo strain while exploiting the $d_{33}$ effect in the direction of the thickness. Since the strain of a plate in the direction of the thickness is low the plates are stacked so as to obtain the cumulative effect of the strain of all the plates. For contacting the electrodes, thin copper foils are embedded in the adhesive layers, led out laterally from the stack and contacted in an alternating manner. Since the adhesive layers reduce the stiffness of the actuator, and consequently the force effect of the actuator, piezoceramic multilayer actuators in which the electrodes are applied as very thin layers (a few μm) to the ceramic green body of the piezoceramic and subsequently sintered with the piezoceramic have been developed. As a result, the electrode is a component part of the monolithic ceramic body. Because no polymer materials are required for constructing the actuator, the multilayer actuator is much stiffer than a conventional stack actuator. Moreover, this type of construction makes it possible to reduce the operating voltage, since more electrodes can be incorporated in the stack with small spacing, without the stiffness of the actuator decreasing drastically.

Based on these cuboidal multilayer actuators known per se, it is proposed with the present invention to provide a piezoceramic actuator which is not cuboidal but plate-shaped. Typical thicknesses, are in the range from 0.1 to 0.3 mm and preferably approximately 0.2 mm. Typical widths are in the range from 10 to 20 mm. Consequently, the advantage of the cuboidal multilayer actuators of a homogeneous field distribution in the effective regions of the piezo composite in actuatory terms, low electromechanical loading of the piezoceramic material in the effective regions in actuatory terms, a much lower operating voltage with the same active strain and the absence of an influence by the thickness of the ceramic on the operating voltage can also be used for a surface actuator. The embedding in a plastic, such as for example a polymer, a fiber composite, etc., achieves the effect that the surface actuator is mechanically stabilized, easy to handle and electrically insulated.

Preferably, the electrodes are sintered with the piezoceramic plates to fort a monolithic ceramic body, in order to form an integral monolithic ceramic block, which is used in the form of a thin plate or wafer for the surface actuator.

It is particularly advantageous if an electrically conducting elastic contact area is respectively applied to the collector electrode surfaces for the positive and negative electrodes. In this way, electrical contacting is ensured for the positive electrodes by way of the positive collector electrode surface and the contact area lying on it. Correspondingly, a negative contact area, which lies on the negative collector electrode surface, is provided for the negative electrodes. The additional elastic contact area leads to high reliability and a long service life of the piezo composite. It prevents cracks that would cause the actuator to fail from being able to form in the piezoceramic. This is so because, in principle, regions with inhomogeneous fields occur at the ends of the electrode fingers. These inhomogeneities lead to mechanical loading of the surrounding material, which could ultimately cause cracks. These cracks are uncritical for the function, singe they are locally limited, but they may damage the collector electrode surface at the edge of the surface actuator. The risk of such damage is reduced by the elastic contact area.

The electrically conducting elastic contact area should be much thicker than the collector electrode surface. It may, for example, be formed from an electrically conducting nonwoven material, a copper cloth or a carbon cloth. The use of a metallized polyester nonwoven material for the contact area is particularly advantageous.

When forming a surface actuator composite from a number of surface actuators arranged next to one another, it is advantageous to provide two mutually adjacent surface actuators respectively with a collector electrode surface, which in each case contacts the positive or negative electrodes of the neighboring surface actuators. The contact electrode area may in this case be integrally connected to the at least one surface actuator in a resin injection protest.

In particular to provide a prestress of the piezoceramic surface actuator that allows tensile loading as well as compressive loading, it is advantageous to embed at least one surface actuator in a polymer composite and produce electrical contact by way of conductor tracks on layers of the polymer composite. The conductor tracks may, for example, be printed or etched on upper and lower layers of the polymer composite.

It is also the object of the invention to provide an improved process for producing such a piezoceramic surface actuator, with the steps of:

a) producing a monolithic cuboidal ceramic block comprising a plurality of piezoceramic plates separated from one another by in each case a positive or negative electrode, wherein the positive and negative electrodes alternate and are constructed integrally with the piezoceramic plates, and b) applying electrically conducting collector electrode surfaces to two opposite exterior sides of the surface actuator in such, a way that the collector electrode surfaces are connected to the associated positive or negative electrodes in a conducting manner.

The object is achieved with this process by the further steps of:

c) cutting the cuboidal ceramic block into plate-shaped surface actuators such that the piezoceramic plates have a much greater width, defined by the spacing of the opposite collector electrode surfaces, than the thickness of the surface actuator, and d) embedding the surface actuator in a plastic.

Advantageous embodiments are described in the subclaims.

BRIEF DESCRIPTION OF THE DRAWINGS

The invention is explained in more detail below by way of example on the basis of the accompanying drawings, in which.

DETAILED DESCRIPTION THE INVENTION

Figure 1:
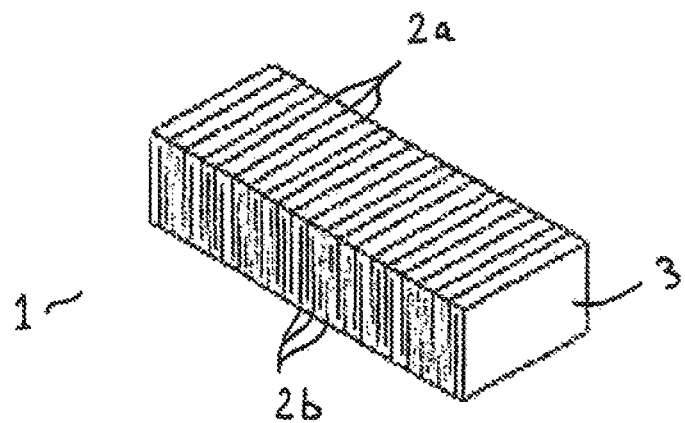
FIGS. 1a) to e) show a diagram of the process for producing a piezoceramic surface actuator from a monolithic cuboidal multilayered piezoceramic block.
Figure 1:
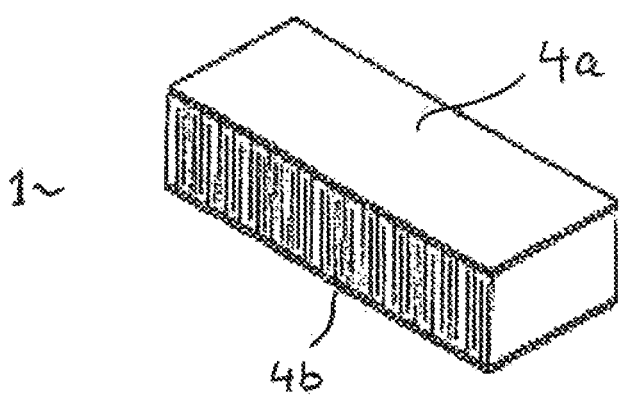
Figure 1:
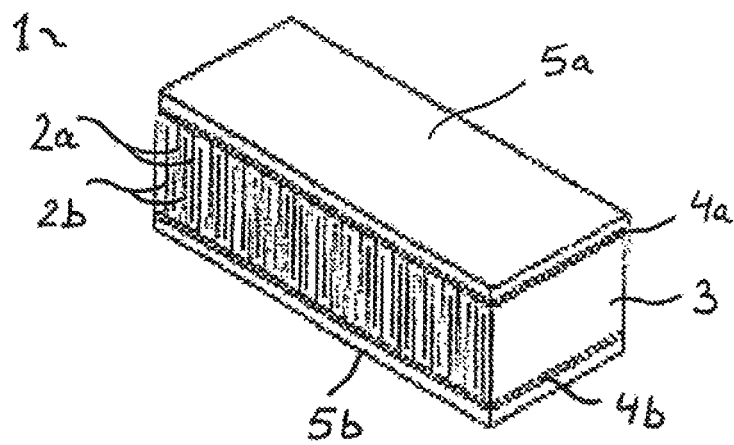
Figure 1:
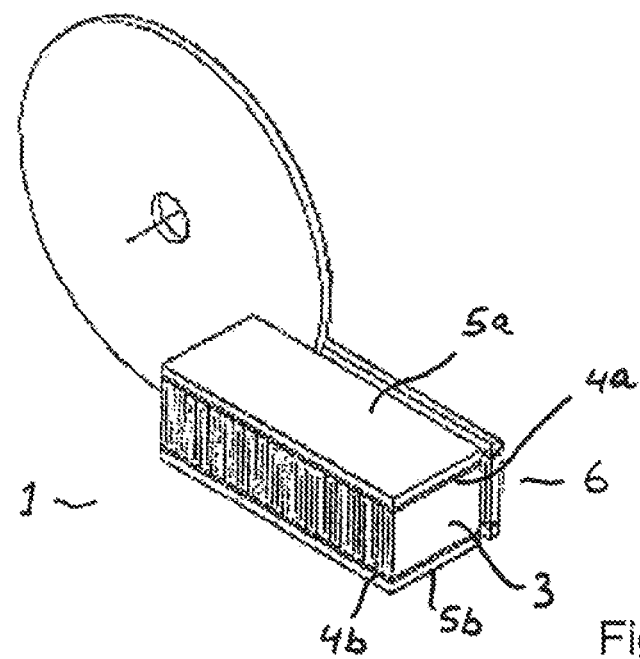
Figure 1:
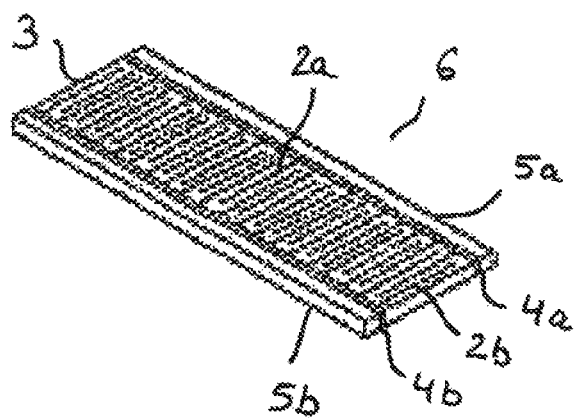

FIG. 1 illustrates in a perspective diagrammatic view the production of a plate-shaped piezoceramic surface actuator.

FIG. 1a) shows an industrially available monolithic multilayer stack 1 as a starting point for the process. The multilayer stack 1 is a monolithic ceramic body, in which positive and negative electrodes 2a, 2b have been sintered with ceramic plates 3 to form a monolithic ceramic body. The positive and negative electrodes 2a, 2b are arranged alternately between in each case two mutually adjacent piezoceramic plates 3.

Figure 2:
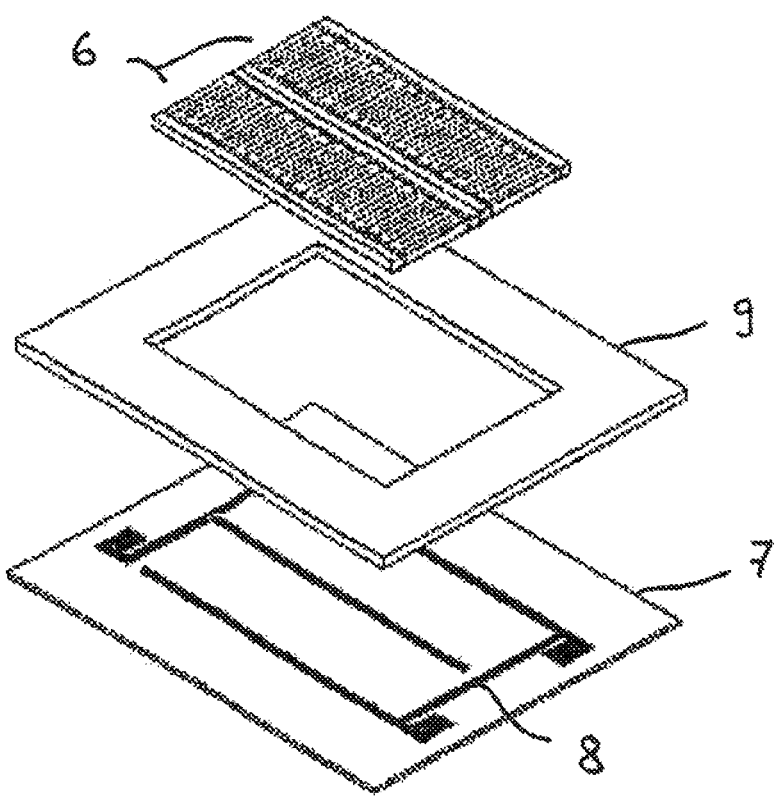
FIG. 2 shows a perspective exploded view of two surface actuators arranged next to one another and embedded in a polymer composite.

FIG. 2 illustrates that, for the electrical contacting of the individual finger-like electrodes 2a, 2b, a thin collector electrode surface 4a, 4b has respectively been applied to two opposite exterior sides of the monolithic ceramic body 1. The collector electrode surfaces 4a, 4b may be produced, for example, by sputtering or screen printing.

External loads or the strains produced by the active operation of the piezoceramic surface actuator may lead to cracks in the thin collector electrodes 4a, 4b. Depending on the location of the crack, this would lead to a partial or complete failure of the surface actuator. To avoid this problem, as diagrammatically indicated in FIG. 1c, an electrically conducting, elastic contact area 5a, 5b has been applied to the collector electrode surfaces 4a, 4b. The material of the contact areas 5a, 5b is thicker than the collector electrode surface 4a, 4b, which may even be omitted, so that the collector electrode surface 4a, 4b is itself forted as the electrically conducting, elastic layer.

Electrically conducting nonwovens, for example a metallized polyester nonwoven, copper cloth, carbon cloth or the like are used, for example, for the elastic contact areas 5a, 5b. The application of the electrically conducting material is preferably performed by a resin injection process although other processes are also possible. To rationalize the process, a number of multilayered monolithic ceramic bodies are combined to form a block and provided simultaneously with the electrically conducting elastic contact area 5a, 5b.

FIG. 1d) illustrates that, in the next step, the monolithic ceramic body 1 prepared in this way is cut into thin wafers with a saw. To simplify the sawing process, additional regions for clamping the ceramics may be attached beforehand.

FIG. 1e) illustrates a plate-shaped piezoceramic surface actuator as a result of the sawing process. In this thin multilayer plate 6, the electrodes are not just arranged on the as in the case of conventional $d_{33}$ surface composites with surface electrodes, but penetrate the cross section almost completely. Very homogeneous electric fields fort. The electrode spacings can be significantly reduced, for example to 50 μm, whereby significantly reduced operating voltages are also obtained, with the same strain. However, the thickness of the multilayer plate 6 does not influence the level of the electric voltage required. The active cross-sectional area can therefore be adapted as desired over wide ranges.

However, the multilayer plate 6 represented in FIG. 1e) is very fragile. For mechanical stabilization, electrical insulation and contacting, the multilayer plate 6 may be embedded in a polymer composite, as represented it FIG. 2. The polymer composite comprises two outer layers 7, only one of which is diagrammatically indicated. Conductor track patterns are applied to the layers 7. Preferably, printed or etched conductor tracks on polyamide or polyester substrates are used. The conductor tracks 8 are arranged in such a way that the elastic contact areas 5a, 5h can be deposited exactly on them. In this case, surface actuators with any number or arrangement of multilayer plates 6 can be constructed, in order to increase the surface area of the piezo composite according, to requirements. The adhesive bonding of the individual components can take place directly. In the example represented, however, a resin injection process is used, additionally involving a frame 9 of an insulating fiber material, preferably a polyester nonwoven. This frame 9 serves as a spacer and positions the multilayer plates 6 in the composite. Furthermore, the frame 9 makes it possible for the resin to flow during the injecting operation. The use of a resin injection process ensures high component quality and reproducibility.

Since the utilization of the composite takes place at elevated temperatures, preferably in the range from 120° C. to 180° C., an advantageous compressive prestress forms in the ceramic body during the cooling process. This is caused by the higher coefficient of thermal expansion of the surrounding polymer material than the piezoceramic.

To rationalize the process, a number of piezo composites may be produced simultaneously and subsequently singulated. The piezo composite reduced in this way it robust and easy to handle and can be used as a surface actuator for any desired applications.

Figure 3:
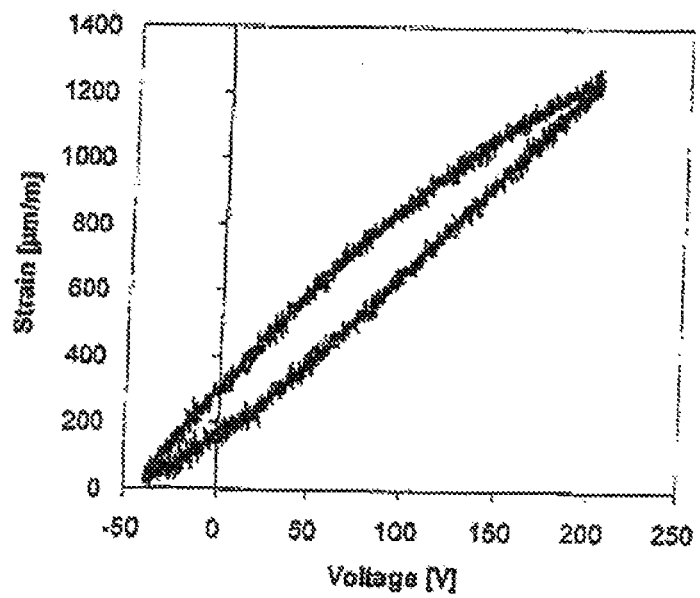
FIG. 3 shows a stress-strain curve, by way of example, of a piezoceramic surface actuator embedded in a polymer composite.

FIG. 3 illustrates a stress-strain curve of a piezoceramic surface actuator embedded in a polymer composite. The strain is plotted in μm/m against, the activation voltage for the piezoceramic surface actuator. It is clear that, with an operating voltage of 200 V, a maximum strain of 1300 μm/m is achieved. Depending on the size and construction, however, higher values of up to at least 1800 u/m can be achieved with a voltage of below, 120 V. The voltage range for the activation is around minus 50 to 200 V. The average strain in the example represented is approximately 4.8 μm/m/V.

The invention claimed is:

1. A piezoceramic surface actuator comprising:
multi-layer plates each having a plurality of piezoceramic plates separated from one another by in each case a positive or negative electrode,
wherein the positive and negative electrodes alternate and are constructed integrally with the piezoceramic plates, and having collector electrode surfaces for the positive and negative electrodes, which are connected to the associated positive or negative electrodes in a conducting manner and are arranged on two exterior sides of the multilayer plates that are opposite from one another, wherein the multilayer plates are plate-shaped and have a much greater width of the piezoceramic plates, defined by the distance between the opposite collector electrode surfaces, than the thickness of the multilayer plates, wherein the surface actuator is embedded in a plastic, and wherein a collector electrode surface is respectively provided for two mutually adjacent multilayer plates and in each case contacts the positive or negative electrodes of the neighboring multilayer plates.

2. The piezoceramic surface actuator as claimed in claim 1, wherein the electrodes are sintered with the piezoceramic to form a monolithic ceramic body.

3. The piezoceramic surface actuator as claimed in claim 1, wherein the collector electrode surfaces are elastic.

4. The piezoceramic surface actuator as claimed in claim 1, wherein an electrically conducting elastic contact area is respectively applied to the collector electrode surfaces for the positive and negative electrodes.

5. The piezoceramic surface actuator as claimed in claim 3, wherein the electrically conducting elastic contact area is much thicker than the collector electrode surface.

6. The piezoceramic surface actuator as claimed in claim 3, wherein the collector electrode surfaces are formed from electrically conducting nonwoven material, selected from the group consisting of a metallized polyester nonwoven material, copper cloth and carbon cloth.

7. The piezoceramic surface actuator as claimed in claim 3, wherein the collector electrode surfaces are integrally connected to the at least one surface actuator in a resin injection process.

8. The piezoceramic surface actuator as claimed in claim 1, wherein at least one multilayer plate is embedded in a polymer composite and electrically contacted by way of conductor tracks on layers of the polymer composite.

9. The piezoceramic surface actuator as claimed in claim 8, the conductor tracks are printed or etched on the upper and/or lower layers of the polymer composite.

10. The piezoceramic surface actuator as claimed in claim 1, wherein multilayer plates are under prestress through the collector electrode surface or the polymer composite.

11. The piezoceramic surface actuator as claimed in claim 1, wherein the collector electrode surfaces are formed from electrically conducting nonwovem material, selected from the group consisting of a metalized polyester nonwoven material, copper cloth and carbon cloth.

12. The piezoceramic surface actuator as claimed in claim 1, wherein the collector electrode surfaces are integrally connected to the at least one multilayer plate in a resin injection process.

* * * * *